_United States Patent_ [19]

Chonan et al.

[11] 4,444,869

[45] Apr. 24, 1984

[54] PROCESS FOR USING POSITIVE-WORKING RESIST MATERIALS TO FORM NEGATIVE RESIST PATTERN ON SUBSTRATE

[75] Inventors: Tsunehiro Chonan, Yokosuka; Akira Morishige, Yamato, both of Japan

[73] Assignee: Fujitsu Limited, Kawasaki, Japan

[21] Appl. No.: 324,687

[22] Filed: Nov. 25, 1981

Related U.S. Application Data

[62] Division of Ser. No. 182,673, Aug. 29, 1980, abandoned.

[30] Foreign Application Priority Data

Aug. 31, 1979 [JP] Japan ............................... 54-110226

[51] Int. Cl.³ ..................... G03F 7/08; G03F 7/26
[52] U.S. Cl. .................... 430/325; 430/191; 430/292; 430/313; 430/318; 430/327; 430/328; 430/330; 430/345; 430/962; 430/331
[58] Field of Search ............. 430/325, 191, 345, 962, 430/192, 292, 330, 327, 328, 318, 313

[56] References Cited

U.S. PATENT DOCUMENTS

| | | | |
|---|---|---|---|
| 3,264,104 | 8/1966 | Reichel | 430/192 |
| 4,007,047 | 2/1977 | Kaplan et al. | 430/325 |
| 4,028,111 | 6/1977 | Iwasaki et al. | 430/191 |

FOREIGN PATENT DOCUMENTS 52-06528  1/1977  Japan ............................... 430/325

_Primary Examiner_—Charles L. Bowers, Jr.
_Attorney, Agent, or Firm_—Staas & Halsey

[57] ABSTRACT

An improved positive-working resist material capable of forming on a substrate either a positive resist pattern or a negative resist pattern. The positive-working resist material comprises a positive-working resist resin having incorporated therein one or more photochromic compounds, such as spiropyrans, triphenylmethane dyes, anils and the like. A positive or negative resist pattern having a remarkably improved definition can be obtained. The use of such a positive-working resist material in the formation of a negative resist pattern on the substrate is also disclosed.

10 Claims, No Drawings

PROCESS FOR USING POSITIVE-WORKING RESIST MATERIALS TO FORM NEGATIVE RESIST PATTERN ON SUBSTRATE

This is a division of application Ser. No. 182,673 filed Aug. 29, 1980, now abandoned.

BACKGROUND OF THE INVENTION

This invention relates to resist materials and, in particular, to improved positive-working resist materials capable of forming on a substrate either a positive resist pattern or a negative resist pattern, and their use in the formation of a negative resist pattern on the substrate.

A variety of resist materials which are useful for forming a desired pattern on a substrate in the production of semiconductor devices are well known in the art. These resist materials are usually classified into two types, namely, negative-type resist materials, which are adapted to form a negative image on a substrate, and positive-type resist materials, which are adapted to form a positive image on a substrate. An unexposed portion of the negative resist material is dissolved in a developer and, as a result of this, a negative image is formed, while an exposed portion of the positive resist material is dissolved in a developer and, as a result of this, a positive image is formed. Representative examples of the negative resist materials include polyvinyl cinnamate photoresists, cyclized rubber photoresists and the like, and representative examples of the positive resist materials include napthoquinonediazide photoresists, benzoquinonediazide photo-resists and the like.

The negative and positive resist materials are used selectively depending upon such factors as the desired image, the particular developer utilized, in particular pattern-forming step used, the particular etching step utilized and the like. However, the selective use of these two materials is technically troublesome and may frequently cause many working errors or mistakes in the fabrication of integrated circuits. Furthermore, in general, the positive resist materials can provide images having an excellent definition, which is higher than that of the images formed through the use of the negative resist materials. Thus, for the purpose of attaining a simple and correct fabrication of integrated circuits at a low cost, it is desired to provide an improved resist material which is useful to optionally form on the substrate either a positive resist pattern or a negative resist pattern. Furthermore, the formed negative resist pattern should have a relatively higher definition. If a higher definition is attained in the resist pattern, the integration of the resulting integrated circuits is increased.

In Japanese Patent Application No. 51-66664, filed on June 9, 1976 (now Patent Laid-open Gazette No. 52-6528), there is disclosed a method of forming a resist layer with a negative pattern on a substrate by using a positive resist containing 1-hydroxyethyl-2-alkylimidazoline. This method comprises the steps of: preparing a substrate having coated thereon a positive-working resist layer containing 1-hydroxyethyl-2-alkylimidazoline, exposing said resist layer to a pattern of radiation, heating said resist layer to a temperature sufficient to insolubilize the exposed area of said layer in a developing solution which will be used in a subsequent step, subjecting said resist layer to a blanket exposure and developing said resist layer with said developing solution. This method is considered to be similar to that of the present invention with regard to the formation of a negative pattern on the substrate by using the positive resist, but cannot fully solve the problems set forth above.

SUMMARY OF THE INVENTION

This invention provides an improved resist material capable of forming on a substrate a positive resist pattern and a negative resist pattern, each of which patterns possesses a definition equivalent to or more than that obtained by the use of the conventional positive resist materials, and a process for the formation of a negative resist pattern possessing a high definition on the substrate using said resist material.

According to this invention, there is provided a positive-working resist material capable of forming on a substrate either a positive resist pattern or a negative resist pattern which comprises a positive-working resist resin having incorporated therein one or more photochromic compounds.

According to this invention, there is also provided a process for the formation of a negative resist pattern on a substrate which comprises the steps of:

(1) coating on the substrate a positive-working resist material which comprises a positive-working resist having incorporated therein one or more photochromic compounds;

(2) exposing the coated resist material to a desired pattern of radiation;

(3) heating the exposed resist material at a temperature of from 95° to 150° C. for 5 through 60 minutes;

(4) subjecting the heated resist material to a blanket exposure; and (5) developing the exposed resist material with an alkaline developer conventionally used for the positive resists.

DETAILED DESCRIPTION OF THE PREFERRED EMBODIMENTS

The positive-working resist materials according to this invention are capable of forming either a positive pattern or a negative pattern on a substrate or a base material, such as $SiO_2$, Si, Al, Cr, Ni and the like, and comprise a positive-working resist resin which is conventionally used in the art, for instance, a novolak resin comprising an ester of quinonediazide and a phenolic hydroxyl-containing monomer or polymer, alkyl methacrylate, such as methyl methacrylate and the like, and a photochromic compound or a mixture thereof incorporated in said resist resin.

The incorporation of the photochromic compound into the positive-working resist resin may be carried out in a conventional manner, for example, by adding the photochromic compound to the resist material and, then, preparing a solution of the mixture with sufficient agitation by means of an agitator, such as stirrer. With regard to the resist materials according to this invention, the ratio of the photochromic compound to the resist resin is not specified or limited and, therefore, may be optionally used within the range or more than 1 part by weight of the photochromic compound per 100 parts by weight of the resist resin. However, in general, the photochromic compound is preferably incorporated into the resist resin in an amount of 1 through 4 parts by weight of the photochromic compound per 100 parts by weight of the resist resin. Assuming that the amount of the photochromic compound used is less than 1 part by weight, it will be impossible or difficult to obtain a positive or negative resist pattern having the desired definition. Furthermore, if the amount of the used photochromic compound is more than 4 parts by weight, the sensitivity of the resulting resist materials will be remarkably decreased.

In the resist materials according to this invention, the photochromic compound may be used separately or in combination, depending upon such factors as the desired image, the particular resist resin used and the like. The photochromic compound useful in this invention is a compound selected from the group consisting of:

(1) trans-cis type compounds;
(2) ion-forming type compounds; and
(3) hydrogen transfer type compounds.

Useful classes of the trans-cis type compounds include azobenzene compounds, such as trans- or cis-azobenzenes, and thioindigo dyes, such as thioindigo, 7,7'-dichloro-thioindigo, 4,4'-dimethyl-6,6'-dibromothioindigo, thioindigo maroon and the like.

Useful classes of the ion-forming type compounds include the spiropyran compound set forth below and triphenylmethane dyes, such as crystal violet, methyl green, malachite green and the like. Illustrative specific spiropyrans useful in the practice of this invention include those set forth in the following Table I.

TABLE I (1) 1,3,3-trimethyl-6'-nitrospiro [indoline-2,2'-benzopyran]
(2) 1,3,3-trimethyl-6'-nitro-8'-methoxyspiro [indoline-2,2'-benzopyran]
(3) 1,3,3-trimethyl-5'-chloro-6'-nitrospiro [indoline-2,2'-benzopyran]
(4) 1,3,3-trimethyl-6'-bromo-8'-bromospiro [indoline-2,2'-benzopyran]
(5) 1,3,3-trimethyl-6'-methoxy-8'-nitrospiro [indoline-2,2'-benzopyran]
(6) 1,3,3-trimethyl-5'-nitro-8'-methoxy-spiro [indoline-2,2'-benzopyran]
(7) 1,3,3-trimethyl-8'-carboxyspiro [indoline-2,2'-benzopyran]
(8) 1,3,3-trimethyl-6'-nitro-8'-hydroxyspiro [indoline-2,2'-benzopyran]
(9) 1,3,3-trimethyl-6'-hydroxyspiro [indoline-2,2'-benzopyran]
(10) 1',3',3'-trimethyl-6'-hydroxyspiro [2H-1-benzopyran-2,2'-indoline]
(11) 1',3',3'-trimethyl-6'-nitrospiro [2H-1-benzopyran-2,2'-indoline]
(12) 1',3',3'-trimethyl-6'-nitro-8'-hydroxy-spiro [2H-1-benzopyran-2,2'-indoline]

Useful classes of the hydrogen transfer type compounds include O-nitro-benzyl derivatives, such as O-nitrobenzyl chloride, O-nitrobenzyl bromide, O-nitrobenzyl alcohol, O-nitrobenzylamine and the like, and anils, such as ethylidene aniline, benzylidene aniline and the like.

The positive-working resist resin useful in this invention is a compound which is well known as a positive photoresist in the art. Representative positive-working resist resins include naphtoquinonediazide photoresists and benzoquinonediazide photoresists. For instance, the naphtoquinonediazide photoresists include AZ-1111, AZ-1350, AZ-1350J, AZ-1370, AZ-1375 and the like, commercially availble from SHIPLEY; OFPR-2, OFPR-77, OFPR-78 and the like, commercially available from TOKYO OHKA LABORATORIES; Waycoat-LSI-Posi, commercially available from HUNT CHEMICAL; and the like, and the benzoquinonediazide photoresists include AZ-111 (SHIPLEY) and the like.

The formation of a resist pattern on a substrate, such as $SiO_2$, Al and the like, using the positive-working resist material according to this invention is carried out as follows.

The substrate is preliminarily washed in a conventional manner to improve the adhesive property of the resist material thereon. Then, the surface of the prewashed substrate is uniformly coated with the resist material according to this invention, namely, the positive-working resist material comprising a positive-working resist having incorporated therein one or more photochromic compounds, in accordance with a conventional coating method, such as a spray coating, a spinner coating, a dip coating, a roll coating and the like. In general, the spinner coating is considered to be preferable from the point of view of the uniformity of the resist coating formed thereby on the substrate and the safety of the coating operation. The thickness of the resist coating may be varied depending on such factors as the particular relation between the viscosity and the concentration of the resist material, the evaporation speed of the solvent used, the rotating speed of the spinner and the like.

Optionally, the coated resist material may be prebaked, before exposure to a desired pattern of radiation, to completely remove the solvent remaining in the resist coating. It is preferable to prebake the resist material at a temperature of from 50° to 110° C., for 5 through 30 minutes, depending on such factors as the particular solvent used and the particular resist material used. The prebaking devices which can be employed are well known in the art and include a source for generating far infrared rays, a convection heater, a convection oven, a circulating hot air oven and the like.

The resist coating is exposed to radiations through a mask having a desired pattern. The useful exposure methods include contact exposure, proximity exposure and projection exposure. The term "radiation" used herein is intended to include any radiations or rays which are conventionally used in the art, such as electron rays, γ-rays, X-rays, ultraviolet radiations, visible rays, infrared radiations and the like.

The exposed resist coating is selectively subjected to either of two subsequent processing steps depending upon a desired image.

If a positive image or resist pattern is desired on the substrate, the exposed resist coating is developed with any conventional alkaline developer for the positive images. For instance, a developer based on sodium methasilicate, to dissolve an exposed portion of the resist coating in the developer and, simultaneously, to retain a non-exposed portion of the resist coating on the substrate. Thereafter, the retained resist coating is postbaked under heating conditions which depend on the particular resist resin, to improve the adhesive property of the resist coating on the substrate. The postbaking can be carried out in a conventional manner. Thus, the positive image or resist pattern is formed on the substrate.

If a negative image or resist pattern is desired on the substrate, it is necessary to add additional processing steps to the procedures as set forth above with regard to the formation of the positive image. The formation of the negative image or resist pattern can be carried out as follows.

Step 1: Preliminary washing of the substrate.
Step 2: Coating of the positive-working resist material on the substrate.
Step 3: Prebaking of the coated resist material.
Step 4: Exposure of the resist coating to a desired pattern of radiations (hereinafter, this exposure is referred as a first exposure).

The resist coating exposed in the step 4 is then heated at a temperature of from 95° to 150° C., preferably from 100° to 120° C., for 5 through 60 minutes, preferably 10 through 30 minutes. Heating of the exposed resist coating in this step is necessary to form the negative image, since it can harden an exposed portion of the resist coating. The exact reaction mechanism of the hardening in the exposed and heated resist coating is not fully understood, but it is believed that ions $=N^+=$ and $O^-$ in the unstable photochromic compound are chemically bonded to the molecule of the positive-working resist resin to form a stable, hardened compound which is not soluble in the developer.

Then, the heated resist coating is subjected to a blanket exposure to decompose a non-exposed portion of the resist coating. The blanket exposure can be carried out by means of the radiation which may be the same or different from those used in the first exposure step. The term "blanket exposure" used herein is intended to mean an overall exposure of the surface of the resist coating to radiation, and is referred to hereinafter as a second exposure.

The thusly obtained exposed resist coating is then developed with an alkaline developer used for the positive images. The developing process is similar to that described above regarding the formation of the positive images. Any conventional alkaline developer for positive images, such as a developer based on sodium methasilicate and the like, may be optionally used if they do not adversely affect the desired results. Representative developers useful in the practice of this invention include an inorganic alkali-based developer, such as sodium methasilicate, sodium phosphate and the like, and a metal-free developer, such as tetramethylammonium hyroxide, $(CH_3)_4NOH$, an aqueous solution of ethanolamine in alcohol and the like. These developers are commercially available, for instance, as MF-312 (AZ developer sold by SHIPLEY) and as NMD-3 and NMD-20 (OFPR developer sold by TOKYO OHKA LABORATORIES).

After development, the negative image or resist pattern is finally formed on the substrate. This image or pattern possesses a high definition, equivalent to that of the positive image or resist pattern which can be obtained in the conventional positive-working resist materials.

The thusly obtained positive or negative image or resist pattern can be used to produce semiconductor devices and the like after the resist coating containing such image or pattern is subjected to the conventional processing steps, such as etching, removal of the resist coating and washing.

The following examples illustrate this invention.

EXAMPLE 1

Formation of Negative Resist Pattern:

One hundred parts by weight of a positive-working photoresist resin (AZ-1350, commercially available from SHIPLEY) was mixed with 1.6 parts by weight of 1',3',3'-trimethyl-6'-nitropiro[2H-1-benzopyran-2,2'-indoline], which is commercially available from EASTMAN ORGANIC CHEMICALS and has the structural formula:

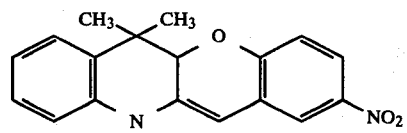

The resulting mixure was filtered and coated on a glass substrate for masking having a chromium-deposited layer formed thereon by means of a spinner at a rotating speed of 3000 r.p.m.

After coating, the resist coating was prebaked at about 95° C. for about 10 minutes and, then, subjected to a first exposure step for 60 seconds, by means of a 250 W high pressure mercury lamp, to form an imagewise pattern on the coating. Thereafter, the exposed resist coating was heated at about 95° C. for 30 minutes to insolubilize its exposed portion in an alkaline developer. The heated resist was then subjected to a second exposure step, namely, a blanket exposure, for about 30 seconds, by means of a 250 W high pressure mercury lamp.

After the second exposure, the resist coating was developed with an alkaline developer which contained, as main components, sodium silicate and sodium phosphate, for one minute. A non-exposed portion of the resist coating was dissolved in the developer. A negative image or resist pattern having a definition of $1\mu$ was formed on the substrate. This indicates that the negative image or resist pattern obtainable in accordance with this invention is remarkably higher in definition than that of the negative image or resist pattern obtainable in a conventional manner.

A metal layer sandwiched between the resulting negative resist pattern and the substrate was etched through the negative resist pattern, which acted as a masking element. Etching was carried out with a conventional etchant which contained, as a main component, ammonium ceric nitrate.

Finally, the resist material remaining on the substrate was removed with acetone or a thick alkaline solution.

Formation of Positive Resist Pattern:

For the purpose of obtaining a positive image or resist pattern on the substrate, the procedure as set forth above was repeated, except that the heating step and the second exposure step were omitted, and a postbaking step, which comprised heating the developed resist coating at 95° C. for 20 minutes, was inserted between the developing step and the subsequent etching step. A positive image or resist pattern having a definition of $1\mu$, which is similar to that of the positive image or resist pattern obtainable in a conventional manner was obtained. The resulting resist pattern was then subjected to the subsequent etching and removal steps as set forth above. Similar results were obtained.

EXAMPLE 2

Formation of Negative Resist Pattern:

The procedure of Example 1 was repeated, except that the rotating speed of the spinner used was 2000 r.p.m., heating after the first exposure was at 110° C. for 20 minutes, the second exposure time was 60 seconds and the developing time was 30 seconds. A negative resist pattern having a high definition of $1\mu$ was formed on the substrate.

Formation of Positive Resist Pattern:

The above procedure was repeated, except that, after the first exposure, the subsequent heating and second exposure steps were omitted, and the developed resist coating was postbaked at 90° C. for 20 minutes. A positive resist pattern having a definition of 1μ was formed on the substrate. This indicates that the incorporation of the photochromic compound into the resist resin does not adversely effect the definition of the positive resist pattern to be formed.

EXAMPLE 3

Formation of Negative Resist Pattern:

The procedure of Example 1 was repeated, except that two parts by weight of the photochromic compound 1',3',3'-trimethyl-6'-hydroxyspiro[2H-1-benzopyran-2,2'-indoline] was incorporated into the resist resin, heating after the first exposure was at 130° C. for 10 minutes, the second exposure time was 60 seconds and the developing time was 30 seconds. A negative resist pattern having a high definition of 1μ was formed on the substrate.

Formation of Positive Resist Pattern:

The above procedure was repeated, except that, after the first exposure, the exposed resist coating was developed without the preceding heating and second exposure steps, and then, was postbaked at 95° C. for 20 minutes. A positive resist pattern having a definition of 1μ was formed.

EXAMPLE 4

Formation of Negative Resist Pattern:

The procedure of Example 3 was repeated, except that prebaking of the resist coating was omitted and the developing time was 60 seconds. A negative resist pattern having a high definition of 1μ was formed on the substrate.

Formation of Positive Resist Pattern:

The above procedure was repeated, except that, after first exposure, the exposed resist coating was developed without the preceding heating and second exposure steps, and then, was postbaked at 95° C. for 20 minutes. A positive resist pattern having a definition of 1μ was formed.

EXAMPLE 5

Formation of Negative Resist Pattern:

One hundred parts by weight of a positive-working photoresist resin (commercially available from Eastman Kodak Company) was mixed with 1.6 parts by weight of 1,3,3-trimethyl-6'-nitro-8'-methoxyspiro[indoline-2,2'-benzopyran]. The mixture was filtered and coated on a glass substrate for masking, having a chromium-deposited layer thereon, by means of a spinner at a rotating speed of 3000 r.p.m.

Thereafter, the resist coating formed on the substrate was prebaked at about 95° C. for about 10 minutes and subjected to a first exposure step for 60 seconds, through a mask having an imagewise pattern, by means of a 250 W high pressure mercury lamp. The imagewise pattern was formed on the resist coating. Then, the exposed resist coating was heat-treated, by heating at 110° C. for 20 minutes, subjected to a second exposure step for about 60 seconds, by means of a 250 W high pressure mercury lamp, and developed with an alkaline developer for one minute. The non-exposed portion of the resist coating was dissolved in the developer. Thus, a negative resist pattern having a high definition of 1μ was formed on the substrate.

Etching of the metal layer and removal of the remaining resist material were carried out as in Example 1. Similar results were obtained.

Formation of Positive Resist Pattern:

The above procedure was repeated, except that, after a first exposure step, the exposed resist coating was developed without the preceding heating and second exposure steps, and then, postbaked at 95° C. for 20 minutes. A positive resist pattern having a definition of 1μ was formed on the substrate.

The formed resist pattern was used as a masking element in the subsequent etching and removal steps as set forth in Example 1. Similar results were obtained.

EXAMPLE 6

Formation of Negative Resist Pattern:

The procedure of Example 5 was repeated, except that the rotating speed of the spinner used was 2000 r.p.m. and the second exposure time was 30 seconds. A negative resist pattern having a definition of 1μ was formed on the substrate.

Formation of Positive Resist Pattern:

The above procedure was repeated, except that, after a first exposure step, the exposed resist coating was developed without the preceding heating and second exposure steps, and then, postbaked at 95° C. for 20 minutes. A positive resist pattern having a definition of 1μ was formed on the substrate.

EXAMPLE 7

The procedure of Example 1 was repeated, except that the photochromic compounds set forth in the following Table II were incorporated into the positive-working resist resin.

TABLE II

| Case No. | Photochromic compound | Amount |
|---|---|---|
| 1 | Malachite green | 1 parts by weight |
| 2 | " | 2 parts by weight |
| 3 | " | 3 parts by weight |
| 4 | Ethylideneaniline | 1 parts by weight |
| 5 | " | 2 parts by weight |
| 6 | " | 3 parts by weight |

In all of Cases 1 through 6, excellent negative and positive images having a definition similar to that in Example 1 were obtained.

The following examples illustrate the use of a blend of two photochromic compounds in the positive-working resist resin.

EXAMPLE 8

Two types of blends consisting of two photochromic compounds (spiropyrans) as set forth above in Table I were prepared.

Type A blend:
    a blend consisting of 1 part by weight of Spiropyran No. 1 and 2 parts by weight of Spiropyran No. 10

Type B blend:
    a blend consisting of 1 part by weight of Spiropyran No. 1 and 4 parts by weight of Spiropyran No. 10

Each of these blends was incorporated into the positive-working resist resin and the resulting resist material was coated on a substrate as in Example 1. The thusly obtained resist coatings were tested with regard to the formation of the negative resist pattern. The results are summarized in the following Tables III, IV, V and VI.

TABLE III

Test 1: Formation of Negative Resist Pattern (With Prebaking)

| | Test A Blend | | | | Test B Blend | | | |
|---|---|---|---|---|---|---|---|---|
| 1st Exposure | 20 sec. | | | | 20 sec. | | | |
| Heating | 95° C./30 min. | | | | 95° C./30 min. | | | |
| 2nd Exposure | 30 sec. | 60 sec. | 90 sec. | 120 sec. | 30 sec. | 60 sec. | 90 sec. | 120 sec. |
| Developing | 30 sec. | | | | 30 sec. | | | |
| Definition of Negative Resist Pattern | bad | good | fair | bad | bad | fair | bad | bad |

TABLE IV

Test 1': Formation of Negative Resist Pattern (With Prebaking)

| | Type A Blend | Type B Blend |
|---|---|---|
| 1st Exposure | 20 sec. | 20 sec. |
| Heating | 95° C./30 min. | 95° C./30 min. |
| 2nd Exposure | 45 sec. | 40 sec. |
| Developing | 50 sec. | 48 sec. |
| Definition of Negative Resist Pattern | good | good |

TABLE V

Test 2: Formation of Negative Resist Pattern (Without Prebaking)

| | Type A Blend | | | | Type B Blend | | | |
|---|---|---|---|---|---|---|---|---|
| 1st Exposure | 20 sec. | | | | 20 sec. | | | |
| Heating | 95° C./30 min. | | | | 95° C./30 min. | | | |
| 2nd Exposure | 30 sec. | 60 sec. | 90 sec. | 120 sec. | 30 sec. | 60 sec. | 90 sec. | 120 sec. |
| Developing | 30 sec. | | | | 30 sec. | | | |
| Definition of Negative Resist Pattern | bad | good | good | fair | bad | good | bad | bad |

TABLE VI

Test 2': Formation of Negative Resist Pattern (Without Prebaking)

| | Type A Blend | Type B Blend |
|---|---|---|
| 1st Exposure | 20 sec. | 20 sec. |
| Heating | 95° C./30 min. | 95° C./30 min. |
| 2nd Exposure | 40 sec. | 40 sec. |
| Developing | 55 sec. | 50 sec. |
| Definiton of Negative Resist Pattern | good | good |

EXAMPLE 9

Two types of blends consisting of two photochromic compounds (spiropyrans) as set forth above in Table I were prepared.

Type C blend:
 a blend consisting of 0.5 parts by weight of Spiropyran No. 1 and 2 parts by weight of Spiropyran No. 10

Type D blend:
 a blend consisting of 0.8 parts by weight of Spiropyran No. 1 and 2 parts by weight of Spiropyran No. 10

Each of these blends was incorporated into the positive-working resist resin and the resulting resist material was coated on a substrate as in Example 1. The thusly obtained resist coatings were tested with regard to the formation of the negative resist pattern. The results are summarized in the following Tables VII, VIII, IX and X.

TABLE VII

Test 3: Formation of Negative Resist Pattern (With Prebaking)

| | Type C Blend | | | | Type D Blend | | | |
|---|---|---|---|---|---|---|---|---|
| 1st Exposure | 20 sec. | | | | 20 sec. | | | |
| Heating | 95° C./30 min. | | | | 95° C./30 min. | | | |
| 2nd Exposure | 30 sec. | 60 sec. | 90 sec. | 120 sec. | 30 sec. | 60 sec. | 90 sec. | 120 sec. |
| Developing | 30 sec. | | | | 30 sec. | | | |
| Definition of Negative Resist Pattern | fair | bad | bad | bad | bad | good | bad | bad |

TABLE VIII

Test 3': Formation of Negative Resist Pattern (With Prebaking)

| | Type C Blend | Type D Blend |
|---|---|---|
| 1st Exposure | 20 sec. | 20 sec. |
| Heating | 95° C./30 min | 95° C./30 min |
| 2nd Exposure | 25 sec. | 30 sec. |
| Developing | 50 sec. | 70 sec. |
| Definition of Negative Resist Pattern | good | fair |

TABLE IX

Test 4: Formation of Negative Resist Pattern (Without Prebaking)

| | Type C Blend | | | | Type D Blend | | | |
|---|---|---|---|---|---|---|---|---|
| 1st Exposure | 20 sec. | | | | 20 sec. | | | |
| Heating | 95° C./30 min. | | | | 95° C./30 min. | | | |
| 2nd Exposure | 30 sec. | 60 sec. | 90 sec. | 120 sec. | 30 sec. | 60 sec. | 90 sec. | 120 sec. |
| Developing | 30 sec. | | | | 30 sec. | | | |
| Definition of Negative Resist Pattern | good | bad | bad | bad | bad | fair | bad | bad |

TABLE X

Test 4': Formation of Negative Resist Pattern (Without Prebaking)

| | Type C Blend | Type D Blend |
|---|---|---|
| 1st Exposure | 20 sec. | 20 sec. |
| Heating | 95° C./30 min. | 95° C./30 min. |
| 2nd Exposure | 30 sec. | 40 sec. |
| Developing | 30 sec. | 40 sec. |
| Definition of Negative Pattern | good | bad |

This invention has been described in detail with particular reference to certain preferred embodiments thereof, but it will be understood that variations and modifications can be effected within the spirit and scope of this invention.

We claim:

1. A process for forming a negative resist with a desired pattern on a substrate, comprising the steps of:

(1) coating on the substrate a resist material consisting of a mixture of a positive-working resist resin which is napthoquinonediazide or benzoquinonediazide and at least one spiropyran compound which is:

1,3,3-trimethyl-6'-nitrospiro(indoline-2,2'-benzopyran),
1,3,3-trimethyl-6'-nitro-8'-methoxyspiro(indoline-2,2'-benzopyran),
1,3,3-trimethyl-5'-chloro-6'-nitrospiro(indoline-2,2'-benzopyran),
1,3,3-trimethyl-6'-bromo-8'-bromospiro(indoline-2,2'-benzopyran),
1,3,3-trimethyl-6'-methoxy-8'-nitrospiro(indoline-2,2'-benzopyran),
1,3,3-trimethyl-5'-nitro-8'-methoxy-spiro(indoline-2,2'-benzopyran),
1,3,3-trimethyl-8'-carboxyspiro(indoline-2,2'-benzopyran),
1,3,3-trimethyl-6'-nitro-8'-hydroxyspiro(indoline-2,2'-benzopyran),
1,3,3-trimethyl-6'-hydroxyspiro(indoline-2,2'-benzopyran),
1', 3', 3'-trimethyl-6'-hydroxyspiro(2H-1-benzopyran-2,2'-indoline),
1',3',3'-trimethyl-6'-nitrospiro(2H-1-benzopyran-2,2'-indoline), or
1', 3', 3'-trimethyl-6'-nitro-8'-hydroxy-spiro(2H-1-benzopyran-2,2'-indoline), wherein said at least one spiropyran compound is mixed with the positive-working resist resin in an amount of 1 through 4 parts by weight of said at least one spiropyran compound per 100 parts by weight of the positive-working resist resin;

(2) prebaking the coated resist material;

(3) exposing the coated resist material to radiation with said desired pattern, so as to allow the exposed part to be selectively hardened in a subsequent heating step;

(4) subsequently heating the coated resist material at a temperature of from 95° to 150° C. for time between 5 through 60 minutes, to provide said selective hardening of said exposed part of said coated resist material, so as to render said exposed part insoluble to an alkaline developer for said positive-working resist resin;

(5) subsequently subjecting the coated resist material to a blanket exposure by further radiation, so as to decompose the non-exposed part of said coated resist material; and (6) subsequently developing the coated resist material by removing said non-exposed part of said coated resist material with said alkaline developer, so as to form said negative resist with said desired pattern.

2. The process of claim 1, comprising less than 2 parts by weight of said spiropyran compound per 100 parts by weight of said positive-working resist resin.

3. The process of claim 1, wherein the coated resist material is not subjected to a liquid as part of said heating of said coated resist material after said exposing to radiation with said desired pattern.

4. The process of claim 1, comprising forming said negative resist with said desired pattern with a resolution of as fine as 1 micron line width.

5. The process according to claim 1, wherein said step of prebaking is carried out at a temperature of from 50° to 110° C. for a period between 5 through 30 minutes.

6. The process of claim 1, 5 or 4, wherein said radiation of said blanket exposure is of the same type as said radiation of said desired pattern.

7. The process of claim 6, wherein different doses of said same type of radiation are used for said blanket exposure and said exposing to said desired pattern.

8. The process of claim 1, 5 or 4, said radiation of said desired pattern and said radiation of said blanket exposure each being selectively electron, gamma, X, ultraviolet, visible and infrared radiation.

9. The process of claim 8, wherein said radiation of said blanket exposure is of the same type as said radiation of said desired pattern.

10. The process of claim 9, wherein different doses of said same type of radiation are used for said blanket exposure and said exposing to said desired pattern.

* * * * *

UNITED STATES PATENT AND TRADEMARK OFFICE
CERTIFICATE OF CORRECTION

PATENT NO. : 4,444,869

DATED : 24 April 1984

INVENTOR(S) : Chonan et al

It is certified that error appears in the above-identified patent and that said Letters Patent is hereby corrected as shown below:

Col. 3, line 21, "compound" should be --compounds--;

line 65, "availble" should be available--.

Signed and Sealed this

Fourth Day of September 1984

[SEAL]

Attest:

GERALD J. MOSSINGHOFF

Attesting Officer     Commissioner of Patents and Trademarks